(12) United States Patent
Ito et al.

(10) Patent No.: US 7,135,853 B2
(45) Date of Patent: Nov. 14, 2006

(54) SEMICONDUCTOR TEST SYSTEM

(75) Inventors: Yoshimasa Ito, Tokyo (JP); Katsuhiko Namiki, Tokyo (JP)

(73) Assignee: Avantest Corporation, Tokyo (JP)

( * ) Notice: Subject to any disclaimer, the term of this patent is extended or adjusted under 35 U.S.C. 154(b) by 0 days.

(21) Appl. No.: 10/939,157

(22) Filed: Sep. 10, 2004

(65) Prior Publication Data

US 2005/0077892 A1    Apr. 14, 2005

(30) Foreign Application Priority Data

Sep. 11, 2003    (JP)    ............... 2003-319366

(51) Int. Cl.
*G01R 31/02*    (2006.01)
(52) U.S. Cl. .................. 324/158.1; 324/755; 324/765
(58) Field of Classification Search ................ 324/765, 324/758, 754, 158.1, 72.5, 755, 761
See application file for complete search history.

(56) References Cited

U.S. PATENT DOCUMENTS

| | | | | |
|---|---|---|---|---|
| 5,703,494 | A * | 12/1997 | Sano ........................... | 324/761 |
| 6,104,204 | A * | 8/2000 | Hayama et al. ............. | 324/760 |
| 6,545,458 | B1 * | 4/2003 | Yamazaki ................. | 324/158.1 |
| 6,545,493 | B1 * | 4/2003 | Iino ........................... | 324/754 |
| 6,838,897 | B1 * | 1/2005 | Kim et al. .................. | 324/760 |

FOREIGN PATENT DOCUMENTS

| | | |
|---|---|---|
| JP | 60-190875 | 9/1985 |
| JP | 10-160788 | 6/1998 |

OTHER PUBLICATIONS

WIPO Search Report with Written Opinion dated Dec. 21, 2004 (6 pages).
Patent Abstracts of Japan; Publication No. 10-160788 dated Jun. 19, 1998 (1 page).
Patent Abstracts of Japan; Publication No. 60-190875 dated Sep. 28, 1985 (1 page).

* cited by examiner

*Primary Examiner*—Minh N. Tang
(74) *Attorney, Agent, or Firm*—Osha Liang LLP

(57) ABSTRACT

A semiconductor test system includes a semiconductor test apparatus for providing a test signal to a device under test and performing a test on the device under test, a performance board for electrically coupling the semiconductor test apparatus and the device under test and a conveyance apparatus for conveying the device under test to electrically couple the device under test to the performance board. The conveyance apparatus includes a box for containing the performance board therein and a conveyance arm for conveying the device under test in order to press the device under test to the performance board and pressing the performance board to an inner face of the box via the device under test, so that a rear face of the performance board is pressed to the box, wherein the rear face corresponds to a position to which the device under test is pressed.

8 Claims, 5 Drawing Sheets

SEMICONDUCTOR TEST SYSTEM

The present application claims priority from a Japanese Patent Application No. 2003-319366 filed on Sep. 11, 2003, the contents of which are incorporated hereby by reference.

BACKGROUND OF THE INVENTION

1. Field of the Invention

The present invention relates to a semiconductor test system. More particularly, the present invention relates to a semiconductor test system for testing a device under test electrically coupled to a semiconductor test apparatus by pressing a performance board, which is electrically coupled to the semiconductor test apparatus, to the device under test.

2. Description of the Related Art

FIG. 1 shows the configuration of a semiconductor test system 10 related to the prior art. In the semiconductor test system 10, a performance board 13 is mechanically coupled to a semiconductor test apparatus 16 by a fitting mechanism 19 and electrically coupled to the semiconductor test apparatus 16 via a connector 18. A conveyance arm 11 holds a device under test 12, allowing the device under test 12 to contact the performance board 13 by pressing the device under test 12 to the vicinity of the centre of the performance board 13 and pressing a board reinforcing structure 14 fixed to a side face of the performance board 13 to a box 15. Moreover, the test is performed by electrically coupling the device under test 12 to the semiconductor test apparatus 16.

FIG. 2 shows the configuration of a semiconductor test system 20 related to the prior art. In the semiconductor test system 20, a performance board 23 is mechanically coupled to a semiconductor test apparatus 26 by a fitting mechanism 29 and electrically coupled to the semiconductor test apparatus 26 via a connector 28. Moreover, a joining mechanism 24 holds the semiconductor test apparatus 26 by mechanically coupling the semiconductor test apparatus 26 to a box 25. A conveyance arm 21 holds a device under test 22 by pressing the device under test 22 to the vicinity of the centre of the performance board 23 so that the device under test 22 contacts the performance board 23. Moreover, the test is performed by electrically coupling the device under test 22 to the semiconductor test apparatus 26.

Since it is known that there have not been any documents of the prior art yet, the documents of the prior art will not be mentioned.

However, although the pressing force caused by the conveyance arm 11 is supported by the firm box 15 in the semiconductor test system 10 shown in FIG. 1, the distance A between the point of application and the supporting point of the pressing force is far as shown by the arrow in FIG. 1 and the pressing force is supported via the parts such as the performance board 13, the board reinforcing structure 17, the connector 18, a board reinforcing structure 14, etc., so the loss of the pressing force occurs due to the friction force among the parts, and thus there is a problem that it is difficult to obtain linearity in the relationship between the pressing force and the amount of deformation of the performance board 13. Moreover, in order to obtain the linearity in the relationship between the pressing force and the amount of deformation of the performance board 13, it is necessary to make a product type exchange part such as the performance board 13, the board reinforcing structure 14, the board reinforcing structure 16, etc., firm or heavy.

Moreover, as shown by the arrow in FIG. 2, the pressing force caused by the conveyance arm 21 is supported by the box 25 via the parts such as the performance board 23, the board reinforcing structure 27, the connector 28, a joining mechanism 24, etc., in the semiconductor test system 20 shown in FIG. 2, so the loss of the pressing force occurs due to the friction force among the parts, and thus there is a problem that it is difficult to obtain linearity in the relationship between the pressing force and the amount of deformation of the performance board 23. Accordingly, in order to make the contact pressure between the device under test 22 and the performance board 23 be a prescribed value, there is a problem that it is impossible to predict the pressing force caused by the conveyance arm 21.

SUMMARY OF THE INVENTION

Therefore, it is an object of the present invention to provide a semiconductor test system, which is capable of overcoming the above drawbacks accompanying the conventional art. The above and other objects can be achieved by combinations described in the independent claims. The dependent claims define further advantageous and exemplary combinations of the present invention.

According to an aspect of the present invention, a semiconductor test system includes a semiconductor test apparatus for providing a test signal to a device under test and performing a test on the device under test, a performance board for electrically coupling the semiconductor test apparatus and the device under test and a conveyance apparatus for conveying the device under test to electrically couple the device under test to the performance board. The conveyance apparatus includes a box for containing the performance board therein and a conveyance arm for conveying the device under test in order to press the device under test to the performance board and pressing the performance board to an inner face of the box via the device under test, so that a rear face of the performance board is pressed to the box, wherein the rear face corresponds to a position to which the device under test is pressed.

The semiconductor test system may further include a board reinforcing structure, of which stiffness is higher than the performance board, provided between the box and the performance board, wherein the conveyance arm presses the rear face of the performance board to the box via the board reinforcing structure. The box may include three or more protrusion sections, of which surface finishing precision is higher than other sections, provided on areas which the board reinforcing structure contacts, and the board reinforcing structure may contact the three or more protrusion sections of the box in a point contact manner.

The semiconductor test system may further include a fitting mechanism for mechanically coupling the semiconductor test apparatus and the board reinforcing structure fixed to the rear face of the performance board, wherein the fitting mechanism may include a recessed section provided in the board reinforcing structure, wherein a hollow is formed in a side face of the recessed section and a projecting section provided in the semiconductor test apparatus, wherein the projecting section includes at least one hard ball, and the hard ball protrudes from a side face of the projecting section, after the projecting section is inserted into the hollow, and is fitted with the hollow of the recessed section. The projecting section may include a shaft having a conical shape near the hard ball and moving in order to allow the hard ball to get into or out of the side face, and the fitting mechanism may further include a cam mechanism provided in the semiconductor test apparatus and allowing the shaft to move.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
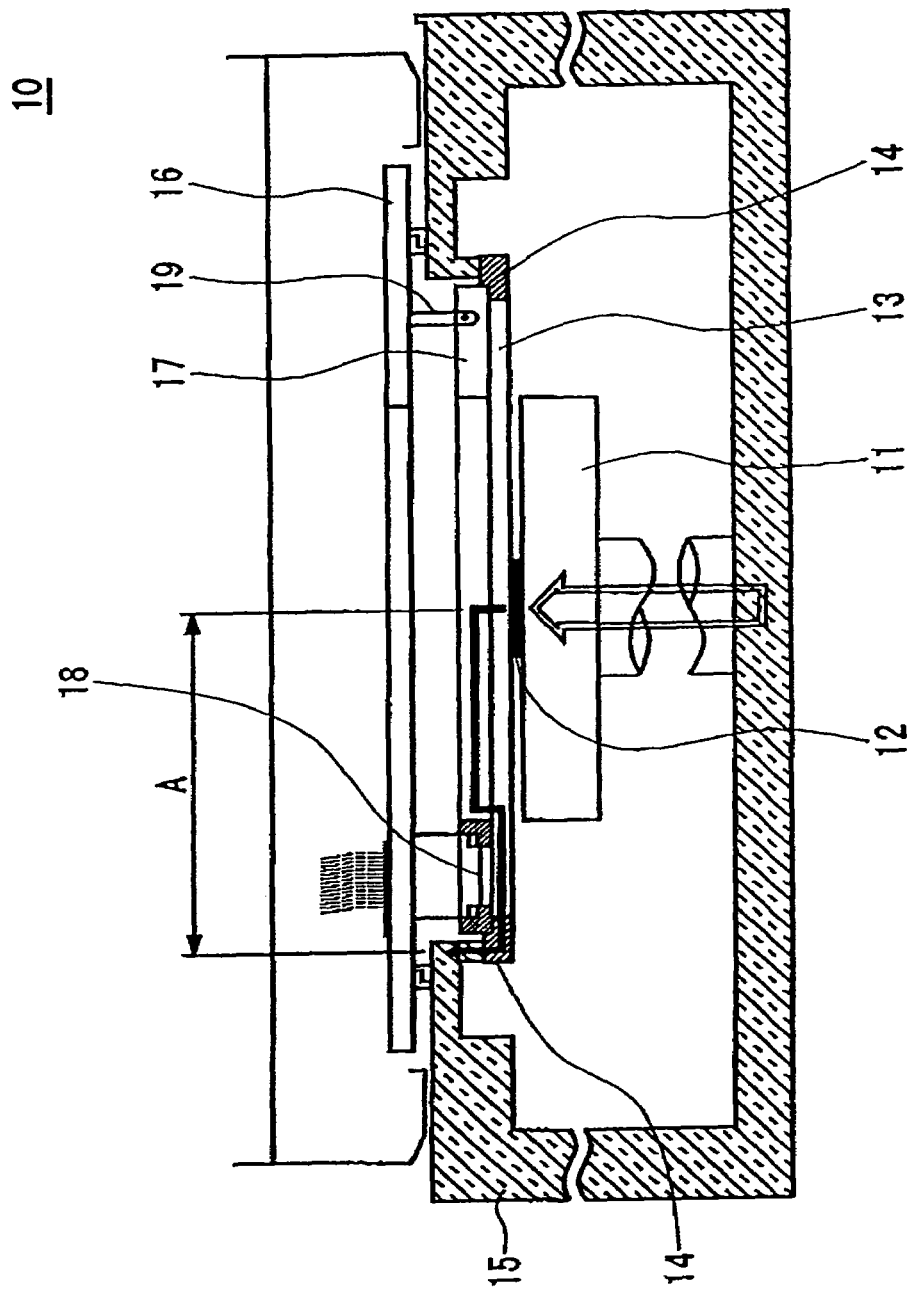
FIG. 1 shows the configuration of a semiconductor test system 10 related to the prior art.
Figure 2:
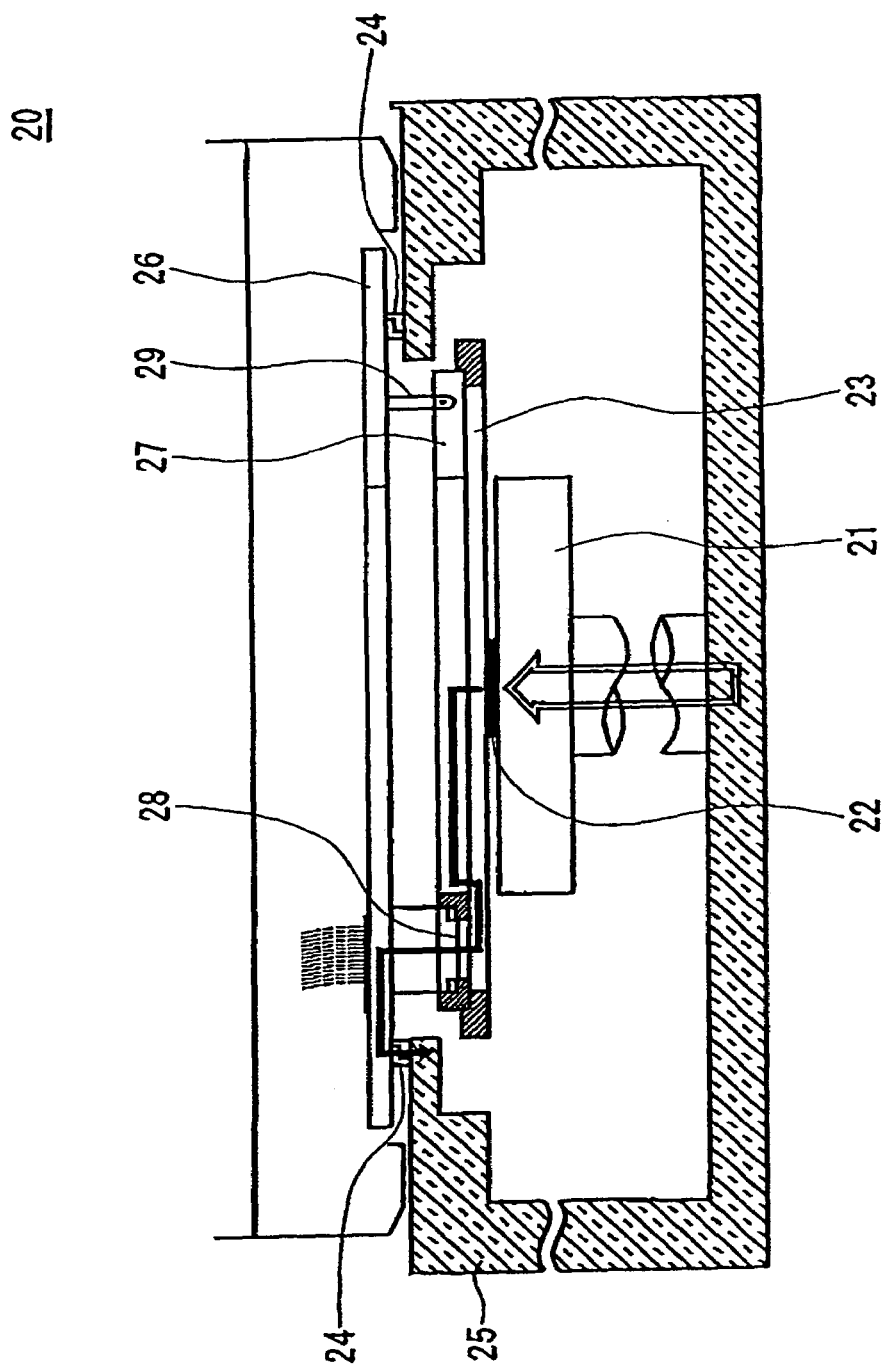
FIG. 2 shows the configuration of a semiconductor test system 20 related to the prior art.
Figure 3:
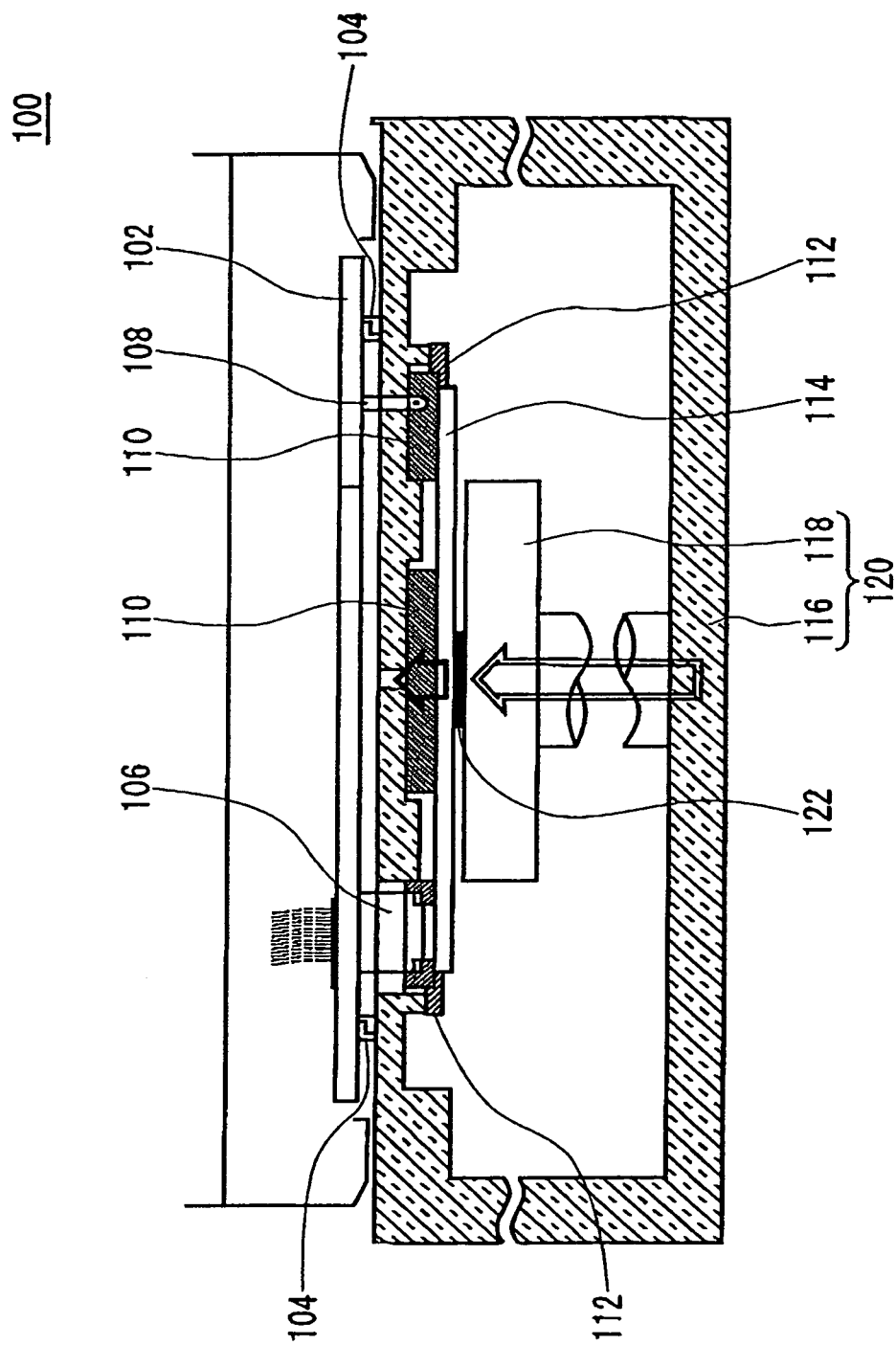
FIG. 3 shows an example of the configuration of a semiconductor test system 100 related to an exemplary embodiment of the present invention.

FIG. 3 shows an example of the configuration of a semiconductor test system 100 related to an exemplary embodiment of the present invention. The semiconductor test system 100 includes a semiconductor test apparatus 102, a joining mechanism 104, a connector 106, a fitting mechanism 108, a board reinforcing structure 110, a board supporting structure 112, a performance board 114, and a conveyance apparatus 120 including a box 116 and a conveyance arm 118.

The connector 106 electrically couples the semiconductor test apparatus 102 and the performance board 114. The performance board 114 electrically couples the semiconductor test apparatus 102 and a device under test 122 via the connector 106. The conveyance apparatus 120 conveys the device under test 122 to make the device under test 122 contact a surface of the performance board 114 and electrically couple the terminals of the device under test 122 to the terminals of the performance board 114. Accordingly, the semiconductor test apparatus 102 is electrically coupled to the device under test 122, and provides a test signal to the device under test 122 to perform the test of the device under test 122.

The box 116 is formed of a high stiffness material, including the board reinforcing structure 110 and the performance board 114 therein. Further, all of the box 116 may not be formed of a high stiffness material, and only a face of the box 116 opposite to the board reinforcing structure 110 or only the vicinity of an area of the face of the box 116 opposite to the board reinforcing structure 110, where the area contacts the board reinforcing structure 110, may be formed of a high stiffness material.

The board reinforcing structure 110 is fixed to a rear face of the performance board 114, to which the device under test 122 is coupled, and provided between an inner face of the box 116 and the performance board 114. Moreover, the fitting mechanism 108 mechanically couples the semiconductor test apparatus 102 and the board reinforcing structure 110 though the box 116. The fitting mechanism 108 couples four places surrounding the board reinforcing structure 110 to the semiconductor test apparatus 102 with fitting members. Further, the fitting mechanism 108 may be a method using vacuum or a motor besides a method shown in FIG. 4. Moreover, it is preferable that the stiffness of the board reinforcing structure 110 is higher than that of the performance board 114. Moreover, the board supporting structure 112 is fixed to a side face of the performance board 114 and supports the position of the performance board 114 by contacting an inner face of the box 116. By the board reinforcing structure 110 and the board supporting structure 112, it is possible to maintain the device under test 122 and the performance board 114 to be substantially parallel.

Figure 5:
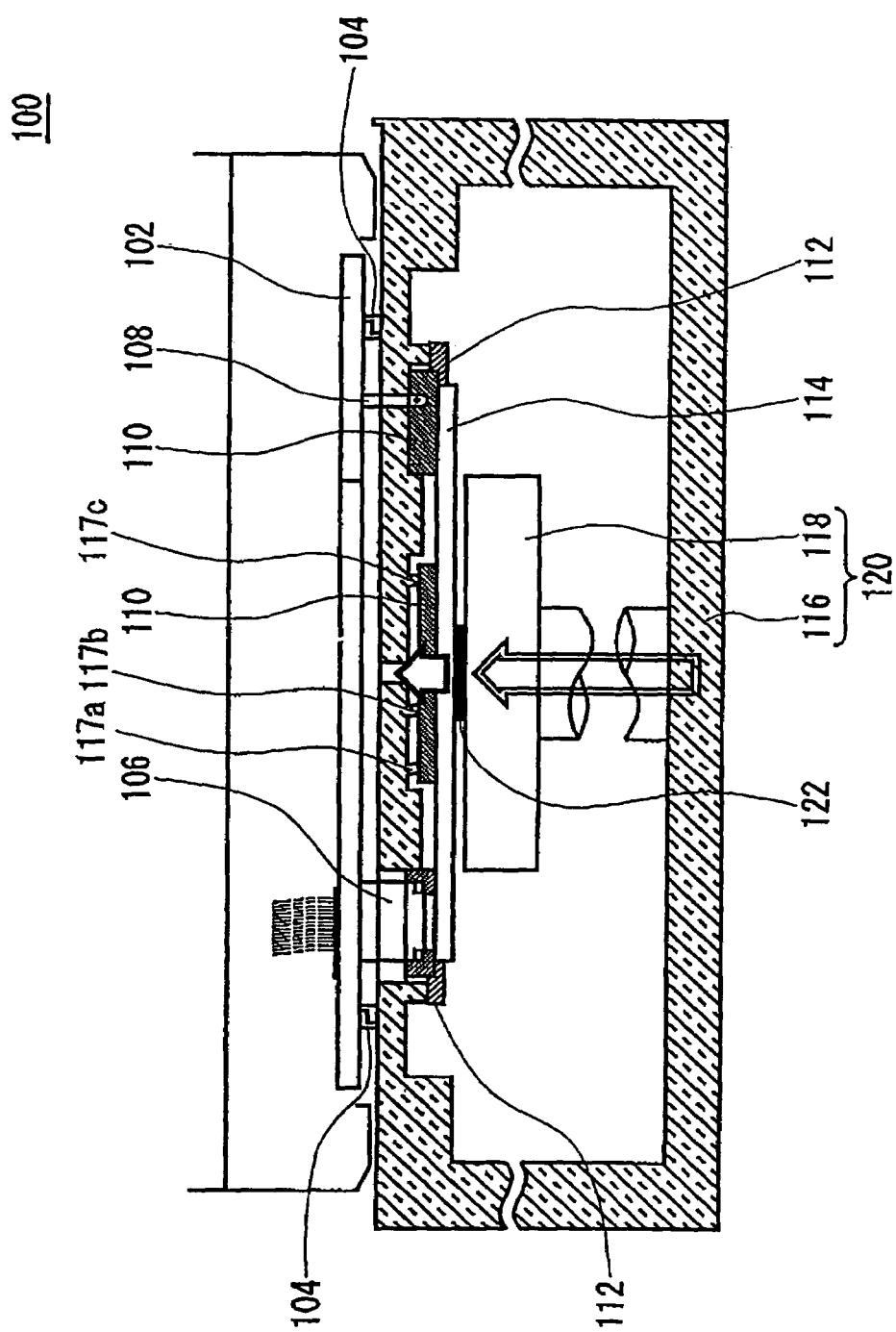
FIG. 5 shows an example of the configuration of an exemplary embodiment of a semiconductor test system 100 including a box 116 with protrusion sections 117a–117c.

Moreover, the box 116 may include at least three protrusion sections, shown as 117a, 117b, and 117c in an exemplary configuration in FIG. 5, of which the surface finishing precision is higher than that of other parts of the box 116, on areas where the board reinforcing structure 110 contacts, and the board reinforcing structure 110 may contact at least three of the protrusion sections of the box 116 in a point contact manner. That is, the board reinforcing structure 110 can prevent the inclination of the performance board 114 caused by dusts sticking to a surface of the box 116 by contacting the box 116 at three or more points, and allows the device under test 122 to stably contact the performance board 114.

The conveyance arm 118 conveys the device under test 122 from the outside to the inside of the box 116 to press the device under test 122 to the performance board 114 and press the performance board 114 to an inner face of the box 116 via the device under test 122. Accordingly, the conveyance arm 118 presses a rear face of the performance board 114, to which the device under test 122 is pressed, via the board reinforcing structure 110 of the box 116 to obtain the contact pressure between the device under test 122 and the performance board 114.

The joining mechanism 104 joins the semiconductor test apparatus 102 and the box 116 by a hook fixed to the semiconductor test apparatus 102 and a hook fixed to the box 116. The joining mechanism 104 is provided on a peripheral part of an area where the semiconductor test apparatus 102 and the box 116 face each other. Further, in the semiconductor test system 100 related to this embodiment, the performance board 114 can be stably held by being pressed to the inner face of the box 116, so the joining mechanism 104 can be removed.

According to the semiconductor test system 100 related to this embodiment, it is possible to obtain the linearity in the relationship between the pressing force caused by the conveyance arm 118 and the amount of the deformation of the box, which is caused by the pressing force, by supporting the pressing force of the device under test 122 right near the point of application of the pressing force with the box 116 formed of a high stiffness material. Therefore, it is possible to predict the amount of deformation of the box 116 required to make the contact pressure between the device under test 122 and the performance board 114 be a prescribed contact pressure, wherein the amount can be predicted from the pressing force caused by the conveyance arm 118, and to reduce the useless conditioning man-hours. Further, since the prescribed contact pressure can be easily realized, the product type exchange part such as the board reinforcing structure 110, the board supporting structure 112, the performance board 114, etc., may not be necessarily formed of a firm and heavy material, and weight reduction can be possible.

Figure 4:
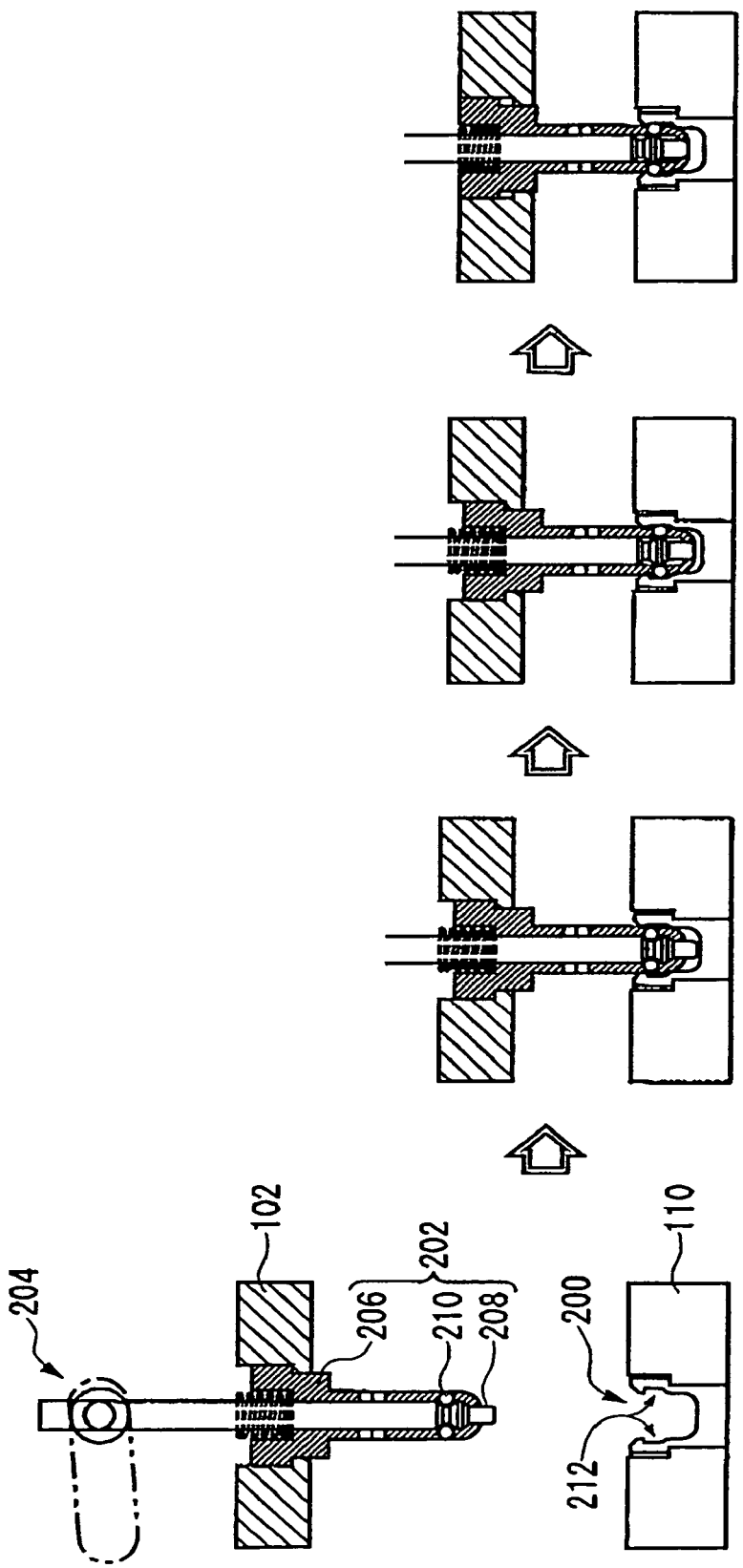
FIGS. 4A through 4D show an example of the configuration of a fitting mechanism 108.

FIG. 4 shows an example of the configuration of the fitting mechanism 108 related to the present embodiment. As shown in FIG. 4(a), the fitting mechanism 108 includes a recessed section 200 provided in the board reinforcing structure 110, a projecting section 202 provided in the semiconductor test apparatus 102, and the cam mechanism 204. The projecting section 202 includes a lock shaft 206, an inner shaft 208, and hard balls 210. The lock shaft 206 forms the outer shape of the projecting section 202. Moreover, the hard balls 210 can get into or out of the lock shaft 206 through a side face of the lock shaft 206. Moreover, the inner shaft 208 having the same axis with the lock shaft is provided along an extension direction inside the lock shaft 206, and the cam mechanism 204 allows the inner shaft 208 to move along the extension direction of the lock shaft 206. Moreover, the inner shaft 208 has a conical shape near the hard balls 210 to allow the hard balls 210 to get into or out of the lock shaft 206 through the side face of the lock shaft 206. In addition, a hollow 212, in which the recessed section 200 is fitted with the hard ball 210, is formed in a side face of the recessed section 200.

After the projecting section 202 is inserted into the recessed section 200 as shown in FIG. 4(b), the hard balls 210 protrudes from the side face of the lock shaft 206 as the inner shaft 208 moves as shown in FIG. 4(c) and are fitted with the hollow 212 of the recessed section 200 as shown in FIG. 4(d).

According to the fitting mechanism 108 related to this embodiment, even if an upper face of the box 116 is provided in order to press the device under test 122, it is possible to couple the semiconductor test apparatus 102 and the product type exchange part with space saving. Moreover, since the product type exchange part is included inside the box 116, it is difficult to couple the semiconductor test apparatus 102 and the product type exchange part by handwork, but they can be fitted with each other by an external operation of the cam mechanism 204. Further, by combining the cam mechanism 204 and the hard balls 210, it is possible to realize a safe structure without unfastening even though the power supply to the semiconductor test apparatus 102 and the conveyance apparatus 120 is stopped.

As obvious from the description above, according to the present invention, it is possible to provide a semiconductor test system for stabilizing the contact condition on the contact points between a device under test and a performance board.

Although the present invention has been described by way of exemplary embodiments, it should be understood that those skilled in the art might make many changes and substitutions without departing from the spirit and the scope of the present invention which is defined only by the appended claims.

What is claimed is:

1. A semiconductor test system, comprising:
   a semiconductor test apparatus for providing a test signal to a device under test and performing a test on said device under test;
   a performance board for electrically coupling said semiconductor test apparatus and said device under test; and
   a conveyance apparatus for conveying said device under test to electrically couple said device under test to said performance board,
   wherein said conveyance apparatus comprises:
      a box for containing said performance board therein, wherein at least a part of said box is located at a rear of said performance board facing said device under test, said part of said box supporting a pressing force applied to said device under test through said performance board; and
      a conveyance arm for conveying said device under test in order to press said device under test to said performance board and pressing said performance board to an inner face of said box via said device under test, so that a rear face of said performance board is pressed to said box,
         wherein said rear face corresponds to a position to which said device under test is pressed.

2. The semiconductor test system as claimed in claim 1, further comprising a board reinforcing structure, of which stiffness is higher than said performance board, provided between said box and said performance board, wherein said conveyance arm presses said rear face of said performance board to said box via said board reinforcing structure.

3. The semiconductor test system as claimed in claim 2, wherein said box comprises three or more protrusion sections, of which surface finishing precision is higher than other sections, provided on areas which said board reinforcing structure contacts, and said board reinforcing structure contacts said three or more protrusion sections of said box in a point contact manner.

4. The semiconductor test system as claimed in claim 2, wherein said board reinforcing structure maintains said device under test and said performance board to be substantially parallel.

5. The A semiconductor test system as claimed in claim 2, further comprising a fitting mechanism for mechanically coupling said semiconductor test apparatus and said board reinforcing structure fixed to said rear face of said performance board, wherein said fitting mechanism comprises:
   a recessed section provided in said board reinforcing structure,
      wherein a hollow is formed in a side face of said recessed section; and
   a projecting section provided in said semiconductor test apparatus,
      wherein said projecting section comprises at least one hard ball, and said hard ball protrudes from a side face of said projecting section, after said projecting section is inserted into said hollow, and is fitted with said hollow of said recessed section.

6. The semiconductor test system as claimed in claim 5, wherein said projecting section comprises a shaft having a conical shape near said hard ball and moving in order to allow said hard ball to get into or out of said side face, and
said fitting mechanism further comprises a cam mechanism provided in said semiconductor test apparatus and allowing said shaft to move.

7. The semiconductor test system as claimed in claim 1, wherein said performance board approximately contacts said box.

8. The semiconductor test system as claimed in claim 1, wherein said device under test and said part of said box where said pressing force is supported are arranged along a direction of said pressing force.

* * * * *

UNITED STATES PATENT AND TRADEMARK OFFICE
CERTIFICATE OF CORRECTION

PATENT NO. : 7,135,853 B2
APPLICATION NO. : 10/939157
DATED : November 14, 2006
INVENTOR(S) : Yoshimasa Ito et al.

It is certified that error appears in the above-identified patent and that said Letters Patent is hereby corrected as shown below:

On the title page item

(73) Assignee, replace "Avantest Corporation" with --<u>Advantest Corporation</u>--.

Signed and Sealed this

Tenth Day of April, 2007

JON W. DUDAS
*Director of the United States Patent and Trademark Office*